(12) United States Patent
Shirasaki

(10) Patent No.: US 6,593,034 B1
(45) Date of Patent: Jul. 15, 2003

(54) FRAMED PELLICLE FOR PROTECTION OF PHOTOLITHOGRAPHIC PHOTOMASK

(75) Inventor: Toru Shirasaki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 80 days.

(21) Appl. No.: 09/706,757

(22) Filed: Nov. 7, 2000

(30) Foreign Application Priority Data

Nov. 8, 1999 (JP) .......................................... 11-316407

(51) Int. Cl.$^7$ ................................................ G03F 9/00
(52) U.S. Cl. ................................ 430/5; 428/14; 355/75
(58) Field of Search ............................. 430/5; 428/14; 355/75

(56) References Cited

U.S. PATENT DOCUMENTS

| | | | |
|---|---|---|---|
| 5,723,860 A | * | 3/1998 | Hamada et al. ............. 250/239 |
| 5,883,704 A | * | 3/1999 | Nishi et al. .................... 355/67 |
| 6,436,586 B1 | * | 8/2002 | Matsuoka et al. ............. 430/5 |

* cited by examiner

Primary Examiner—Mark F. Huff
Assistant Examiner—Saleha R. Mohamedulla
(74) Attorney, Agent, or Firm—Wenderoth, Lind & Ponack, L.L.P.

(57) ABSTRACT

An improvement is provided in the photolithographic patterning of a photoresist layer by pattern-wise exposure to short-wavelength ultraviolet light through a pattern-bearing photomask which is dustproof protected by mounting a framed pellicle thereon. With an object to overcome the troubles therein due to absorption of short-wavelength ultraviolet light by oxygen and the interaction of atmospheric oxygen in the space surrounded by the photomask and the framed pellicle with the energy of the short-wavelength ultraviolet, the framed pellicle is provided in the frame with at least two gas-passage openings through which the air inside is replaced with nitrogen in conducting the ultraviolet exposure. The openings are preferably covered with a filter member and covered further with a covering member having a gas nozzle which is connected to a feed source of an inert gas such as nitrogen.

2 Claims, 1 Drawing Sheet

FRAMED PELLICLE FOR PROTECTION OF PHOTOLITHOGRAPHIC PHOTOMASK

BACKGROUND OF THE INVENTION

The present invention relates to a novel framed pellicle for protection of a photolithographic photomask or, more particularly, to a framed pellicle used for dustproof protection of a photomask used in the technology of photolithographic patterning by pattern-wise exposure of a photoresist layer to actinic rays such as ultraviolet light through a pattern-bearing photomask in the manufacturing processes of LSIs, VLSIs, liquid crystal display panels and the like.

Photolithography is a well established technology frequently employed in the manufacturing process of fine semiconductor devices such as LSIs and ULSIs as well as liquid crystal display panels in which a photoresist layer formed on a substrate surface is pattern-wise exposed to actinic rays such as ultraviolet light through a pattern-bearing transparency, which is called a photomask, mounted on or held above the photoresist layer and the thus pattern-wise exposed photoresist layer is then subjected to a development treatment.

One of the serious problems in the technology of photolithography is that dust particles are deposited on the pattern-bearing photomask more or less even in a clean room of the highest class of cleanness and, once dust deposition takes place on the photomask, absorption, irregular reflection and scattering of the exposure light are unavoidable thereby resulting in degradation of the quality of patterning of the resist layer hence adversely affecting the performance of the devices manufactured by utilizing the process of photolithography.

In view of the difficulty in complete prevention of dust particle deposition on the photomask even in a clean room of the highest class, a conventional measure undertaken in the photolithography is that a framed pellicle is mounted on the photomask and the pattern-wise irradiation of the photoresist layer is performed through the photomask with ultraviolet light transmitting the pellicle membrane of the framed pellicle. The framed pellicle here implied is an integral device consisting of a rectangular or circular frame of a rigid material such as stainless steel, aluminum and the like, referred to as the pellicle frame hereinafter, having a relatively small height, of which the two end surfaces are substantially parallel each to the other, and a thin, highly transparent plastic resin film, referred to as the pellicle membrane hereinafter, spread over and adhesively bonded to one of the substantially parallel end surfaces of the pellicle frame in a slack-free fashion.

FIG. 1 is a vertical cross sectional view of a conventional framed pellicle consisting of a rectangular or circular pellicle frame 2 of a rigid material and a thin, highly transparent plastic resin film 1 as the pellicle membrane which is spread over and adhesively bonded with intervention of an adhesive layer 3 to one of the end surfaces of the pellicle frame 2 in a slack-free fashion. The other end surface of the pellicle frame 2 is, though optional, coated with a pressure-sensitive adhesive to form an adhesive layer 4 by means of which the framed pellicle mounted on a photomask 5 is secured at the position in a demountable fashion.

When a framed pellicle is mounted on the photomask 5, dust particles never fall directly onto the photomask 5 but are deposited on the upper surface of the pellicle membrane 1. The dust particles deposited on the pellicle membrane 1 have no particularly adverse influences on the quality of patterning since the exposure light such as ultraviolet light is usually focused not to the dust particles on the pellicle membrane 1 but to the pattern-bearing photomask 5 which is at least several millimeters below the pellicle membrane 1.

The material of the pellicle membrane 1 is not particularly limitative provided that the material is a plastic resin capable of giving a thin film of good mechanical strength having high transparency to the exposure light. Examples of suitable plastic resins include nitrocellulose, cellulose acetate and fluorocarbon resins. Examples of the material for the pellicle frame 2 include aluminum, stainless steel and polyethylene. The pellicle membrane 1 is adhesively bonded to one of the end surfaces of the pellicle frame 2 by a known method. For example, the end surface of the pellicle frame 2 is moistened with a solvent having good dissolving power to the plastic resin of the pellicle membrane 1 and the membrane 1 spread slack-free is brought into contact with the end surface of the pellicle frame 2 before complete evaporation of the solvent (see Japanese PatentKokai 58-219023). Alternatively, of course, the pellicle membrane 1 can be bonded to the end surface of the pellicle frame 2 by using an adhesive such as acrylic resin-based, epoxy resin-based and fluorocarbon polymer-based adhesives. The other end surface of the pellicle frame 2 opposite to the pellicle membrane 1 is coated with a pressure-sensitive adhesive 4 by means of which the framed pellicle is secured onto the surface of the photomask 5. Examples of suitable pressure-sensitive adhesives include polybutene resin-based, polyvinyl acetate-based, acrylic resin-based and silicone resin-based adhesives (see U.S. Pat. No. 4,861,402, Japanese Patent Publication 63-27707 and Japanese Patent Kokai 7-168345). When the pressure-sensitive adhesive layer 4 is formed, it is preferable that the sticky surface of the adhesive layer 4 is temporarily protected by attaching a releasable paper sheet to the surface until actual use of the framed pellicle.

Along with the requirement in the photolithographic patterning technology of recent years for finer and finer pattern resolution, it is a remarkable trend in photolithography until now that, in order to satisfy this requirement, the pattern-wise light exposure of the photoresist layer is conducted by using a light source emitting a light of a shorter and shorter wavelength. To be more particular, the g-line light of 436 nm wavelength and the i-line UV light of 365 nm wavelength are now under the process of replacement with the deep UV light as the KrF excimer laser beam of 248 nm wavelength and, in the near future, with vacuum UV light as the ArF excimer laser beam of 193 nm wavelength. Even the $F_2$ excimer laser beam of 158 nm wavelength is already within the scope of possibility in the near future to accomplish a still finer pattern resolution.

Use of the above mentioned short-wavelength laser beams as an exposure light source for the patterning works of photoresist layers, however, is accompanied by several difficult problems. For example, a substantial portion of the laser beams is absorbed by the air present in the optical path to the photomask because oxygen in the air has an absorption band within the wavelength region of the laser beams employed. Further, the molecules of oxygen in the air eventually cause a reaction to form ozone molecules by absorbing the energy of the laser beams.

These problems accompanying the use of a short-wavelength laser beam as the exposure light source can of course be solved, in principle, by completely removing oxygen from the optical path of the exposure machine having a laser beam emitter mounted thereon or by filling the optical path with nitrogen gas. Namely, the air inside of the exposure machine should be fully replaced with nitrogen after introduction or setting of a semiconductor silicon wafer or a photomask therein to ensure such a low concentration of oxygen as not to exhibit any adverse influences.

When a framed pellicle is mounted on the photomask 5, however, the space 10 surrounded by the pellicle membrane 1, pellicle frame 2 and photomask 5 is necessarily a closed space so that, once a photomask 5 with a framed pellicle mounted thereon is brought into and set in an exposure machine, it is no longer possible to replace the air in the closed space with nitrogen gas to solve the problem due to oxygen in the optical path unless the air in the closed space is replaced in advance with nitrogen gas in the photomask shop of the device-manufacturing plant where the service of mounting a framed pellicle onto a photomask is usually undertaken.

In addition, it is sometimes possible that certain organic gaseous materials are emitted from the pressure-sensitive adhesive forming the adhesive layer 4 on the lower end surface of the pellicle frame 2 to fill the closed space above the photomask 5 and the organic gases may eventually enter a reaction due to the energy of the laser beams for exposure, to thereby cause problems.

SUMMARY OF THE INVENTION

The present invention accordingly has an object, in view of the above described problems and disadvantages encountered in the photolithographic patterning process by using framed pellicles of the prior art, to provide a novel and improved framed pellicle by which the gaseous atmosphere of the space above the photomask is controllable after mounting of the framed pellicle onto the photomask.

Thus, the framed pellicle provided by the present invention for dustproof protection of a photomask in the photolithography comprises, as an integral body:

(a) a pellicle frame, having two end surfaces each substantially in parallel to the other, made from a rigid material; and (b) a pellicle membrane made from a transparent plastic resin film spread over and adhesively bonded to one of the end surfaces of the pellicle frame in a slack-free fashion, the pellicle frame having at least two gas-passage openings each communicating, when the framed pellicle is mounted on a photomask, the space surrounded by the pellicle frame and the photomask, with the atmosphere outside of the framed pellicle.

It is preferable that each of the gas-passage openings in the pellicle frame is covered or plugged with a filter member which prevents intrusion of particulate matter from the outer atmosphere into the space above the photomask when the framed pellicle is mounted on the photomask.

The above defined framed pellicle can be used in a method for pattern-wise exposure of a photoresist layer on a substrate surface to ultraviolet light. The method for pattern-wise exposure of a photoresist layer to ultraviolet light through a photomask bearing an image pattern comprises the steps of:

(1) mounting the above defined framed pellicle of the invention onto the photomask;

(2) replacing the air in the space surrounded by the framed pellicle and the photomask with a gas free from oxygen, referred to as an inert gas hereinafter, by introducing the inert gas from at least one but not all of the gas-passage openings in the pellicle frame and discharging the gas through the rest of the gas-passage openings;

(3) holding the photomask with the framed pellicle mounted thereon on or above the photoresist layer; and (4) irradiating the photoresist layer through the photomask with ultraviolet light penetrating the pellicle membrane.

DETAILED DESCRIPTION OF THE PREFERRED EMBODIMENTS

The above defined inventive framed pellicle, which has been completed as a result of the extensive investigations undertaken by the inventor on the base of a unique idea that the problems and disadvantages in the prior art framed pellicles could be overcome by providing the pellicle frame with at least two gas-passage openings to serve as a ventilation means, is described below in more detail by making reference to the accompanying drawing.

Figure 1:
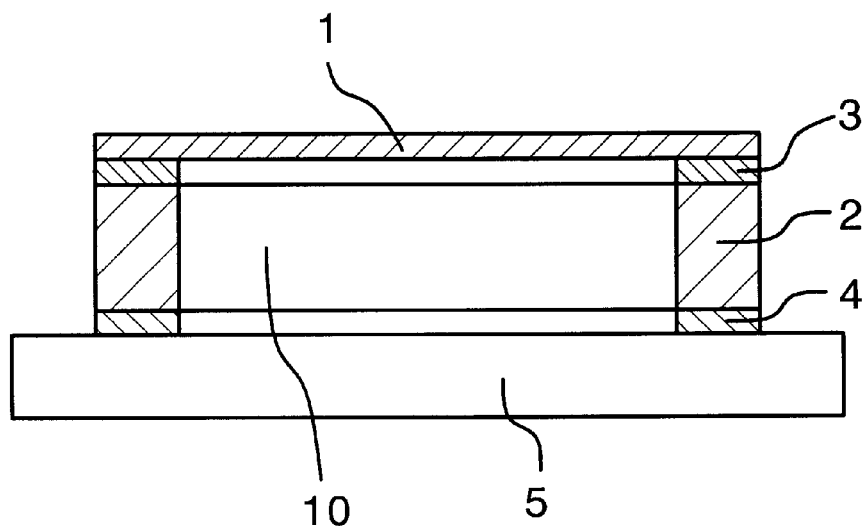
FIG. 1 is a vertical cross sectional view of a conventional framed pellicle mounted on a photomask.
Figure 2:
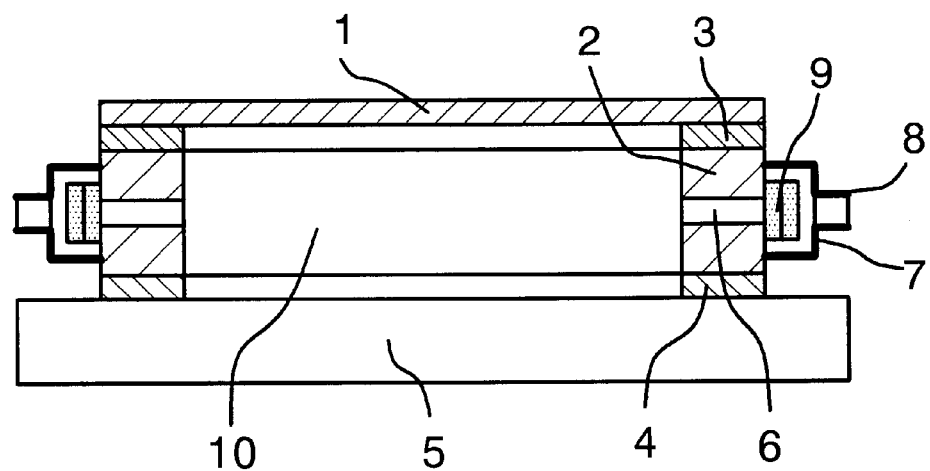
FIG. 2 is a vertical cross sectional view of the inventive framed pellicle having gas-passage openings and mounted on a photomask.

FIG. 2 is a schematic vertical cross sectional view of the inventive framed pellicle mounted on a photomask 5 and secured at the position by means of a pressure-sensitive adhesive layer 4. Like the conventional framed pellicle illustrated in FIG. 1 by a vertical cross sectional view, the framed pellicle of the invention consists of a pellicle frame 2 made from a rigid material and a thin, highly transparent pellicle membrane 1 of a plastic resin film bonded to one of the end surfaces of the pellicle frame 2 with intervention of an adhesive layer 3 therebetween.

Besides, the inventive framed pellicle is provided in the pellicle frame 2 with at least two gas-passage openings 6,6 penetrating the pellicle frame 2 and communicating the space 10 surrounded by the photomask 5 and the framed pellicle mounted thereon with the atmosphere outside of the framed pellicle. It is preferable that each of the gas-passage openings 6,6 is covered with a porous filter member 9 or plugged with a porous plug member by which passage of any particulate materials can be blocked. The dimensions of the gas-passage openings 6,6 are not particularly limitative.

In order to facilitate replacement of the air in the space 10 with an inert gas, it is preferable that a covering member 7 is attached to the pellicle frame 2 to cover each of the gas-passage openings 6,6. The covering member 7 has a gas nozzle 8 which can be connected to a gas-feed line or to a gas-discharge line (not shown in the figure) through which the air in the space is purged from or an inert gas such as nitrogen is introduced into the space 10. The material of the covering member 7 with a gas nozzle 8 is not particularly limitative but can be selected from fluorocarbon resins, polypropylene resins, nylon resins, stainless steels and the like. The covering member 7 can be connected to the pellicle frame 2 by using a suitable adhesive.

The "inert" gas, which replaces the air in the space 10, is not particularly limitative provided that the gas has no or little absorption of the short-wavelength ultraviolet light and does not pertain to any ultraviolet-induced reactions as oxygen does. Examples of suitable inert gases include nitrogen, helium, argon and the like, of which nitrogen is preferred in respect of the low cost of the gas.

The filter member 9 covering each gas-passage opening 6 serves to capture any particulate materials which, in the absence of the filter member 9, might be brought into the space 10 as being carried by the inert gas introduced through the opening 6. Accordingly, it is a minimum requirement that only the openings 6 which serve as the gas inlet are provided with the filter members 9. It is, however, a safety measure that all of the openings 6,6 are provided each with a filter member 9 when accidental or out-of-the-ordinary running conditions are taken into consideration.

In the following, the framed pellicle of the invention is described in more detail by way of Examples, which, however, never limit the scope of the invention in any way.

EXAMPLE 1

A rectangular pellicle frame of aluminum having inside dimensions of 149 mm by 122 mm was provided with two penetrating holes of a 0.5 mm diameter at two opposite positions to serve as the gas-passage openings and a 0.3 mm thick mesh screen of a fluorocarbon resin having a mesh opening of 0.1, $\mu$m diameter was attached to the frame to cover the opening as a filter member. Each of the openings covered with the filter members was further covered with a covering member of a fluorocarbon resin having a gas nozzle of 2.0 mm inner diameter. One of the end surfaces of the aluminum frame was coated with an adhesive and a film of a fluorocarbon resin having a thickness of 1 $\mu$m was spread over and adhesively bonded to the adhesive-coated end surface of the aluminum frame in a slack-free fashion.

The thus prepared framed pellicle was coated on the other end surface of the pellicle frame with a pressure-sensitive adhesive and mounted on a photomask of fused silica glass plate and secured to the position by means of the pressure-sensitive adhesive layer.

One of the gas nozzles was connected to a feed line of nitrogen gas and nitrogen gas was introduced through the gas nozzle at a rate of 100 ml per minute. The discharged gas coming out of the other gas nozzle was analyzed for the content of oxygen after 30 minutes of nitrogen gas introduction to fail to detect more than a trace concentration of oxygen in the discharged gas indicating that the space surrounded by the photomask and the framed pellicle was filled with substantially pure nitrogen gas.

Pattern-wise exposure of a photoresist layer to fluorine excimer laser beams of 158 nm wavelength could be undertaken through the photomask covered with the framed pellicle after filling the space therebetween with nitrogen without any troubles.

For comparison, the same pattern-wise exposure test as above was undertaken except that the space surrounded by the photomask and the framed pellicle was filled with air as such to detect appearance of fogginess on the surfaces of the pellicle membrane and photomask after 10 times of exposure runnings presumably due to deposition of some reaction products formed from the gases within the space by interacting with the laser beams.

EXAMPLE 2

The experimental procedure was about the same as in Example 1 except that the rectangular pellicle frame of aluminum was provided with four, instead of two, gas-passage openings each at the center position of one of the four sides and the nitrogen gas feed line was connected to the gas nozzle of one of the four covering members to introduce nitrogen gas at a rate of 10 ml per minute for 10 minutes. The gases discharged out of the other three gas nozzles were collected and analyzed for the concentration of oxygen to fail to detect more than a trace concentration of oxygen therein indicating that the space surrounded by the photomask and the framed pellicle was filled with substantially pure nitrogen gas.

The exposure test to fluorine excimer laser beams by using the above described assembly of the photomask and framed pellicle with the space filled with nitrogen could be successfully conducted without any troubles like in Example 1.

What is claimed is:

1. A framed pellicle for dustproof protection of a photomask in photolithography which comprises, as an integral body:

(a) a pellicle frame, having two parallel end surfaces, made from a rigid material; and (b) a pellicle membrane made from a transparent plastic resin film spread over and adhesively bonded to one of the end surfaces of the pellicle frame in a slack-free fashion, the pellicle frame having at least two gas-passage openings each communicating the space surrounded by the pellicle membrane and the pellicle frame with the atmosphere outside of the pellicle frame, and wherein at least one of the gas-passage openings is covered with a covering member having a gas nozzle.

2. The framed pellicle as claimed in claim 1 in which each of the gas-passage openings is covered or plugged with a filter member.

* * * * *